US009706693B2

(12) United States Patent
Hunt et al.

(10) Patent No.: US 9,706,693 B2
(45) Date of Patent: Jul. 11, 2017

(54) RECYCLABLE CIRCUIT ASSEMBLY

(71) Applicants: Christopher Hunt, Sunbury (GB); John Lewison, Northants (GB); Robin Pittson, Lydney (GB)

(72) Inventors: Christopher Hunt, Sunbury (GB); John Lewison, Northants (GB); Robin Pittson, Lydney (GB)

(73) Assignees: IN2TEC LIMITED (GB); NPL MANAGEMENT LIMITED (GB); GWENT ELECTRONIC MATERIALS LIMITED (GB)

( * ) Notice: Subject to any disclaimer, the term of this patent is extended or adjusted under 35 U.S.C. 154(b) by 396 days.

(21) Appl. No.: 13/750,184

(22) Filed: Jan. 25, 2013

(65) Prior Publication Data

US 2013/0188323 A1   Jul. 25, 2013

(30) Foreign Application Priority Data

Jan. 25, 2012   (GB) .................................. 1201227.4

(51) Int. Cl.
| | |
|---|---|
| *H05K 1/00* | (2006.01) |
| *H05K 13/00* | (2006.01) |
| *H05K 3/32* | (2006.01) |
| *H05K 1/02* | (2006.01) |
| *H05K 1/18* | (2006.01) |
| *H05K 3/22* | (2006.01) |
| *H05K 3/00* | (2006.01) |

(52) U.S. Cl.
CPC ........... *H05K 13/00* (2013.01); *H05K 1/0277* (2013.01); *H05K 1/181* (2013.01); *H05K 3/321* (2013.01); *H05K 3/0058* (2013.01); *H05K 3/22* (2013.01); *H05K 2201/2009* (2013.01); *H05K 2203/0769* (2013.01); *H05K 2203/0776* (2013.01); *H05K 2203/088* (2013.01); *H05K 2203/176* (2013.01); *H05K 2203/178* (2013.01); *Y02P 70/611* (2015.11); *Y02P 70/613* (2015.11);

(Continued)

(58) Field of Classification Search
USPC ........................................ 361/750, 760, 749
See application file for complete search history.

(56) References Cited

U.S. PATENT DOCUMENTS

| 3,625,763 A | 12/1971 | Melillo |
|---|---|---|
| 4,171,240 A | 10/1979 | Wong |

(Continued)

FOREIGN PATENT DOCUMENTS

| DE | 4439239 A1 | 5/1996 |
|---|---|---|
| EP | 1 198 162 A2 | 4/2002 |

(Continued)

OTHER PUBLICATIONS

European Extended Search Report and the European Search Opinion dated May 2, 2013; for European Pat. App. No. 13152780.6; 8 pages.

(Continued)

*Primary Examiner* — Andargie M Aychillhum
(74) *Attorney, Agent, or Firm* — Daly, Crowley, Mofford & Durkee, LLP

(57) ABSTRACT

An electronic circuit assembly comprises a substrate and circuit components attached to the substrate by means of an electrically conductive adhesive, wherein the adhesive is releasable under predetermined release conditions, whereby to enable the circuit components to be removed from the substrate for recovery or re-use.

18 Claims, 3 Drawing Sheets

(52) U.S. Cl.
CPC ......... *Y10T 156/10* (2015.01); *Y10T 156/1111* (2015.01); *Y10T 156/1153* (2015.01)

(56) References Cited

U.S. PATENT DOCUMENTS

| | | | |
|---|---|---|---|
| 6,005,292 | A | 12/1999 | Roldan et al. |
| 6,139,661 | A * | 10/2000 | Cronin .................. C09J 5/00 156/247 |
| 2002/0005247 | A1 | 1/2002 | Graham et al. |
| 2004/0145089 | A1* | 7/2004 | Burrows ............... C09K 11/02 264/496 |

FOREIGN PATENT DOCUMENTS

| | | | |
|---|---|---|---|
| JP | 2003133688 | A | 5/2003 |
| JP | 2008235822 | A | 10/2008 |

OTHER PUBLICATIONS

European Response filed on Jan. 31, 2014 to an Official Communication dated Aug. 5, 2013; for European Pat. App. No. 13152780.6; 19 pages.
European Communication pursuant to Article 94(3) EPC dated Apr. 15, 2014; for European Pat. App. No. 13152780.6; 5 pages.
European Response filed on Aug. 11, 2014 to the Official Communication dated Apr. 15, 2014; for European Pat. App. No. 13152780.6; 12 pages.
Examiner's Search Report dated May 21, 2013; for British Pat. App. No. GB1301354.5; 4 pages.
Examination Report dated May 15, 2015; for British Pat. App. No. GB1301354.5; 6 pages.

* cited by examiner

RECYCLABLE CIRCUIT ASSEMBLY

CROSS REFERENCE TO RELATED APPLICATIONS

This application claims the benefit of, and priority to, United Kingdom Patent Application No. GB 1201227.4, filed on Jan. 25, 2012, which application is incorporated by reference herein in its entirety.

FIELD

The present invention relates to an electronic circuit assembly, and in particular a printed circuit assembly, which can be easily disassembled after use. More particularly, the invention provides for the separation and recovery of components and materials of the circuit, allowing for reuse, recycling or improved disposal.

BACKGROUND

Traditional printed circuit boards (PCBs), populated with electronic components, are usually disposed of at the end of their useful life either by incineration or as landfill. This can give rise to undesirable pollutants, increasing volumes of non-biodegradable waste products, and wasting of materials and components which could in theory be reused.

European Waste Electrical and Electronic Equipment (WEEE) legislation is likely to require that up to 70% of electronic equipment waste is recycled. Currently, over 100 million electrical units are discarded annually in the UK, with 85% of this waste going to landfill and the remainder being sent to furnaces in order to reclaim precious metals.

There is therefore a desire to provide a technology which enables easy reuse and/or recycling of electronic circuits and components, both to meet the requirements of legislation and to benefit from the economic advantages of recovery of expensive components and reusable materials.

The present invention provides an electronic circuit assembly which utilises particular adhesives in the construction of the assembly and the attachment of components to a substrate, which allow for the disassembly of the structure, and the separation and recovery of constituent parts and components for recycling or reuse. In particular, the adhesives are designed to be releasable (or 'unzippable') under certain conditions (e.g. heating and/or exposure to water at elevated temperature range), to allow for disassembly under these conditions, which enables straightforward disassembly of the circuit components whilst allowing the circuit to function normally in conventional operating conditions. This leads to very high percentage recovery levels and recyclability above 90% achieved. Electrically conductive and non-conductive adhesives can be used in different parts of the assembly, as appropriate, to provide the required structural and/or electrical connections, while still enabling the assembly to be separated out easily into its constituent parts as required. Using the technique and adhesives described below, it has been found that the adhesives themselves are recoverable, such it is possible to separate the adhesives from the circuit components and substrate(s) for reuse or disposal of the individual constituents of the assembly, in a way which is not possible with soldered components, since solder cannot be recovered in a way which allows for reuse of the substrate.

Conventional electronic circuits have traditionally utilised solders for the attachment and electrical connection of components. Reworking of solder connections is possible, for example for the replacement of failed components, but this is impractical and inefficient as a way of recovering circuit components for reuse. Adhesives have been known to be used in the manufacture of electronic circuits, but this is typically for the purpose of locating components in position, while electrical connections are made using conventional soldering techniques. For example, U.S. Pat. No. 4,215,025 A discloses the use of a water soluble polymeric compound to keep components in place on a printed circuit board during soldering operations, after which the compound is completely removed using a water rinse, leaving a conventionally soldered circuit board.

SUMMARY OF THE INVENTION

In accordance with the present invention, an electronic circuit assembly comprises circuit components attached to a substrate by means of an adhesive, wherein the adhesive is releasable under certain release conditions, to allow for separation of the components and the substrate. The separation of the components allows for recovery, safe disposal, reuse or recycling, etc. The release conditions may require heating to a specific temperature, e.g. above 80° C., 80° C. to 100° C., or above 100° C., or exposure to water or another solvent. These conditions may also be applied in combination, e.g. the adhesive may release on immersion in hot water.

The circuit components may be electronic components releasably attached to the substrate by means of an electrically conductive adhesive, which may be applied to the substrate in a required circuit pattern and makes electrical connections between the components and the substrate, as well as securing the components in place. In this case, the components are releasable from the substrate under the release conditions applicable to the conductive adhesive. The components may be secured by the conductive adhesive to conductive tracking provided on the substrate to form the required electrical circuit. One advantage of the invention is that circuit components may be releasably mounted on a first surface of the substrate, with the adhesive making the required mechanical and electrical connections to conductive tracking provided on the same side of the substrate, such that the components can be easily released by applying the release conditions to the assembly. This is greatly advantageous when compared with, for example, components mounted on a first surface of a substrate and connected via through holes to tracking provided on a second, opposite surface of the substrate, typically being soldered in position on the second side.

Alternatively, the circuit components may be part of an electrical circuit integrally formed on a flexible substrate, and the flexible substrate may be attached to a rigid substrate by means of a releasable adhesive, which may be electrically non-conductive.

In one embodiment, the circuit assembly comprises a rigid substrate, a flexible substrate provided on the rigid substrate and comprising conductive tracking, and electronic circuit components mounted on the flexible substrate, wherein the electronic components are mounted on the flexible substrate by means of an electrically conductive releasable adhesive, and the flexible substrate may be attached to the rigid substrate by means of a further releasable adhesive. The further releasable adhesive may be a non-conductive adhesive, where no electrical connection is required between the flexible substrate and the supporting, rigid substrate, whereas the conductive adhesive used to mount the components on the flexible substrate is used to make the necessary electrical connections with the tracking in order to form the required electrical circuit. The use of releasable adhesives has also been found to allow two such circuits to be bonded to each other whereby to facilitate releasable disassembly.

The invention also provides a method of disassembling an electronic circuit assembly as set out in claim 11, and a method of manufacturing an electronic circuit assembly as set out in claim 16.

BRIEF DESCRIPTION OF THE DRAWINGS

An embodiment of the invention will now be described, by way of example, with reference to the drawings, in which.

DETAILED DESCRIPTION OF THE INVENTION

Figure 1A:
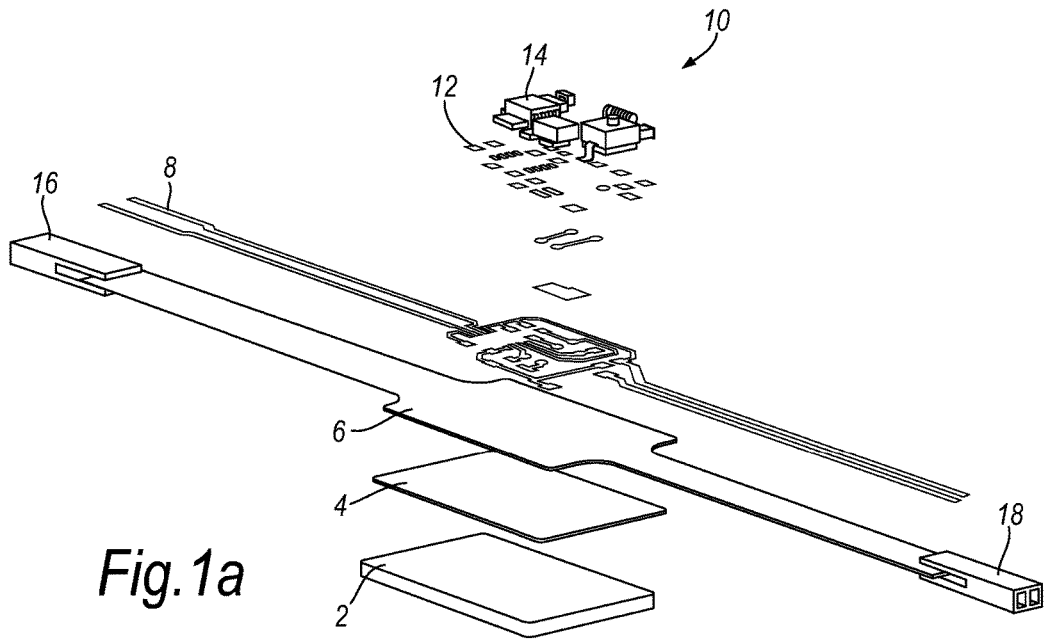
FIG. 1(a) shows an exploded view of a printed circuit assembly.

FIG. 1(a) shows an embodiment of a printed circuit assembly 10 according to the invention, comprising a rigid substrate (or 'rigidiser') 2, a releasable non-conductive adhesive layer 4, a flexible substrate 6, printed flexible conductive tracking 8, a pattern of releasable electrically conductive adhesive 12, and electronic circuit components 14.

The flexible substrate 6 is provided with the conductive tracking 8, which may be printed on its surface, in order to provide the necessary circuit tracks for connection of the electronic components to form the circuit. The tracking also provides for electrical connection with external components (e.g. power supplies, external circuits, etc) to which the assembly 10 may be connected by means of connectors 16, 18 provided at ends of the flexible substrate. The circuit provided on the flexible substrate may comprise multiple layers of conductive tracking (not shown) as required, which may be separated where necessary by insulating or dielectric layers. The tracking may be printed onto the flexible substrate in the form of a conductive ink or other flexible conductor, and the flexible substrate may also have certain electrical components integrally formed on its surface (e.g. resistances, switches, connection points) which may form part of the circuit of the completed assembly 10.

The flexible substrate 6 is mounted to the rigid substrate 2 by means of the releasable adhesive layer 4, which in this case may be non-conductive. The rigid substrate provides rigidity to the completed assembly, if required, but the electrical circuitry may be contained exclusively on and within the flexible substrate 6, which may also be capable of providing the required circuit without the presence of the rigid substrate 2.

Additional electric circuit components 14, which may be higher value electronic components including integrated circuits or microprocessors, are mounted onto the flexible substrate 6 by means of electrically conductive releasable adhesive 12, which is provided by any appropriate means (e.g. screen printing or stencil printing, or other suitable dot dispense printing techniques) into a pattern on the flexible substrate 6 and tracking 8 in order both to secure the components 14 in place and make the required electrical connections of the components 14 within the circuit.

Figure 1B:
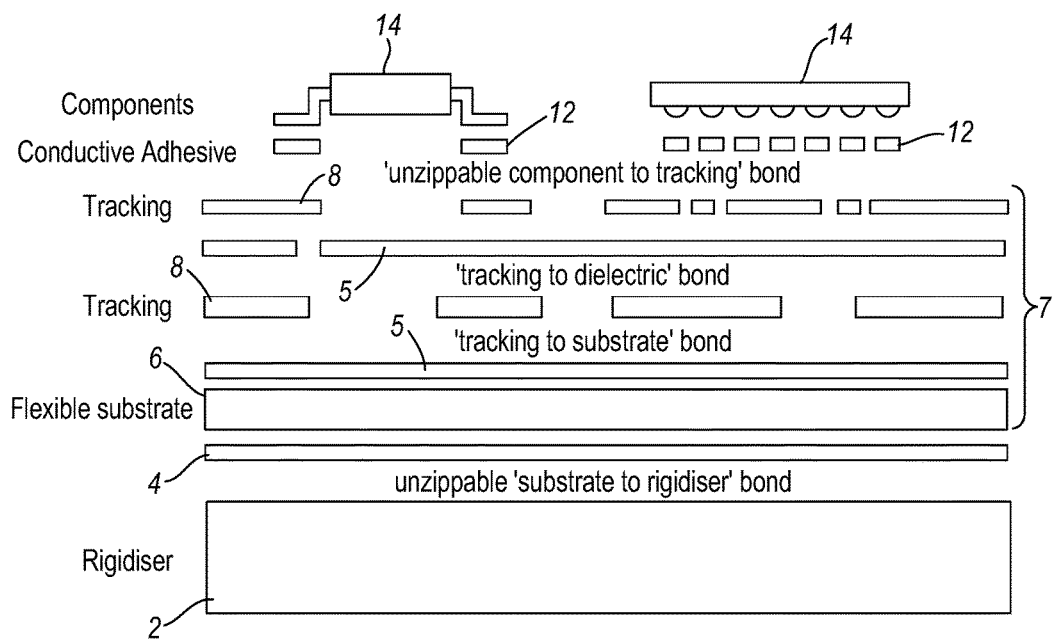
FIG. 1(b) shows schematically a cross-section of the assembly of FIG. 1(a)

FIG. 1(b) shows the layers of assembly 10 in cross-section: the flexible substrate 6 and tracking layers 8, together with appropriate bonding layers 5, form a flexible circuit layer 7, which is mounted to the rigid substrate 2 by means of the releasable non-conductive adhesive layer 4. Conductive releasable adhesive layer 12 provides an electrical connection pattern, as well as a secure but releasable adhesive mounting, for electrical circuit components 14.

Figure 2:
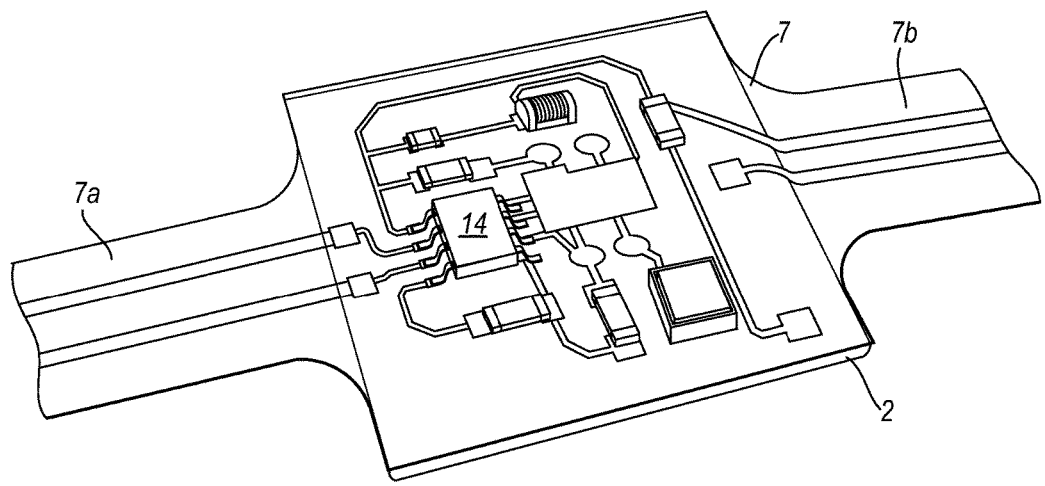
FIG. 2 shows the circuit assembly of FIG. 1 in its assembled form.

The complete assembly is shown in FIG. 2, which shows the flexible circuit layer 7 affixed to the rigid substrate 2, with the electrical circuit components 14 mounted on top of the combined rigid and flexible substrates. It can be seen that the flexible circuit layer 7 in this example provides for external connections by means of extending flexible portions 7a, 7b which do not overlie an area of rigid substrate 2, since no additional components are required to be supported in these regions, and therefore no additional rigidity is necessary, and these portions can be used to provide flexible connection leads.

The circuit assembly of FIG. 2 might form, for example, a lighting control circuit, where one end of the flexible circuit layer is connected to a power source, and the other end is connected to a lighting circuit, by means of the connectors 16, 18 (not shown in FIG. 2). However, the assembly may be used to provide any kind of electrical circuitry in place of conventional printed circuit boards. The adhesive layer 4 ensures secure connection of the flexible circuitry to the rigid substrate 2 during conventional operating conditions of the circuit assembly, and likewise the conductive adhesive layer 12 provides both the required electrical connections and the physical securing of the components 14.

At the end of the life of the circuit, instead of being disposed of in landfill as is conventional, the assembly can be disassembled to its major constituent parts by releasing, or unzipping, the releasable adhesive layers by applying the release conditions. Depending on the adhesives, these conditions may involve exposing the adhesive to a temperature, or solvent, which is not encountered during normal operation of the circuit, but which is simple to apply without being onerous in terms of energy use. For example, the adhesives may be engineered to release on being raised to a temperature of around 80-100° C., which is outside the normal operating temperature, but requires much less energy than the recovery of precious metals in a furnace. Alternatively, the adhesives may be water soluble, and be engineered to release on exposure to hot water. Different adhesives within the assembly may have different release conditions, allowing them to be released separately, if required.

Figure 3:
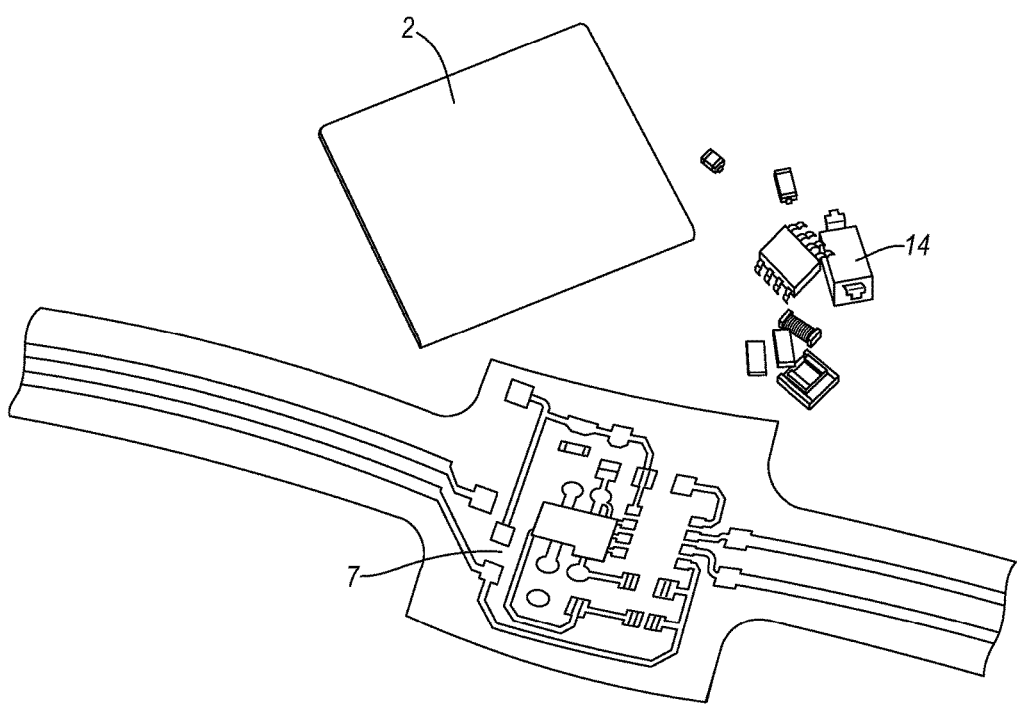
FIG. 3 shows the circuit assembly of FIG. 2 disassembled into its constituent parts following release of the adhesive layers, for recovery of the components.

In a typical example, in order to recover the constituent parts of the assembly, it is merely necessary to place the assembly in hot water for a short while, in order to soften and initiate the water-releasable adhesive. The circuit components can then be easily separated from the flexible substrate, e.g. by gently sweeping or scraping them along the surface to the edge, and the components are then recovered for recycling, reuse or separate disposal. Likewise, the flexible circuit layer can be peeled from the rigid substrate on release of the adhesive layer 2. In this way, the complete working assembly can be quickly and easily reduced to its constituent parts as shown in FIG. 3, which shows the separated rigid substrate 2, flexible circuit layer 7 and electrical circuit components 14.

Other arrangements may be provided for separating the components, for example using a steam jet to heat the adhesive, while also physically separating the components from the substrate, resulting in a very fast and effective recovery.

It has also been found that by peeling the flexible substrate from the rigid substrate with a sufficiently small radius of peeling, the circuit components can be simultaneously removed from the flexible substrate, resulting in a complete disassembly in one operation.

In the illustrated embodiment, the rigid substrate may be a polyester substrate, which typically makes up around 70% of the weight of the assembly in the embodiment shown. This arrangement leads to a printed circuit assembly which may be around 90% recyclable.

The same technique may be used to apply the flexible circuit layer to many different kinds of rigid substrate material for support, due to the simplicity of the adhesive attachment, and the rigid substrate is not limited to that illustrated and described in this embodiment. Furthermore, the flexible circuit layer need not be provided with a rigid substrate at all, if sufficient support for any components which are present can be achieved without such a rigid substrate, or otherwise, smaller rigid substrates may be used only in parts of the circuit, and other areas may be provided only with a flexible substrate. Alternatively, electrical circuit components may be attached directly to a rigid substrate or other circuit board provided with appropriate conductive tracking, and the components may be attached using a conductive releasable adhesive as described above, but without the presence of the flexible layer. It has been found that the use of a rigid substrate facilitates the removal of the components from the assembly, although the components can also be removed easily where they are provided on only a flexible substrate. The flexible substrate may be formed from polyimide, PEN or PET, or any other material suitable for this application, which will be apparent to the skilled person.

The described system of releasable adhesive attachment can be used with both two-dimensional and three-dimensional (planar and non-planar) circuitry, which may comprise rigid or flexible structures. For example, circuitry can be formed to fit over a three-dimensional curved surface on which it is required to be located, either by forming the circuit on a flexible substrate or forming it as a rigid structure but having the required shape.

Various different releasable adhesives may be used in the invention. Suitable materials will be apparent to the skilled person from the properties specified for the various adhesives in the description below. In different embodiments, different types of adhesives may be required, and may be used in various combinations as appropriate, depending on the presence or absence of a rigid substrate or a flexible substrate, etc. Typically, a first adhesive may be required ('Bond A') to releasably join the rigid substrate to the flexible substrate, where present. Further materials are typically required (Bond B) to form the flexible circuit layer on the flexible substrate, and may include conductive and non-conductive inks, used as appropriate to form the required circuitry. Further conductive adhesive may be required (Bond C) to releasably connect additional electrical circuit components onto the flexible circuit layer.

In one form, the adhesives are engineered to utilise thermoplastic properties of the adhesive material in such a way that the adhesive is sufficiently set at the operating temperature range of the circuit to securely mount the components in place, but at the elevated release temperature, the components can be easily separated. Such thermoplastic materials have the benefit that they can be reused (e.g. circuit components can be removed and replaced using the same adhesive), whereas water soluble adhesives cannot. Furthermore, thermoplastic adhesives can allow for movement and repositioning of components during processing. However, water soluble releasable adhesives may be preferred in some embodiments, depending on the required release conditions.

Suitable polymeric non-conductive adhesives can be engineered for use in conductive applications by the incorporation of conductive particles (e.g. silver) into the polymer structure.

In summary, therefore, the adhesives may comprise non-conductive thermoplastic adhesives selected to provide an appropriate release temperature for the circuit components (e.g. above 80° C., between 80-100° C., or above 100° C.). The adhesives may be selected to be suitable for application to the substrates by screen printing or bar coating. Alternatively, the adhesives may comprise water soluble adhesives. Appropriate conductive adhesives, where required, may be formed by incorporating conductive particles, e.g. silver particles, into the non-conductive adhesives, in a known manner. Any of the adhesives and inks may undergo an appropriate curing step after application to the relevant substrate.

Examples of types of adhesive suitable for use in the invention are described below.

Bond A—Non-Conductive Adhesives Which may be Used to Join the Rigid Substrate to the Rest of the Circuitry Non-Conductive Adhesive 1 (Dry Heat Unzippable)

This high-grab adhesive is thermally releasable, and has been designed to be screen printed, or bar coated, onto rigid and flexible substrates, that can then be bonded by pressing or rolling together. At the end of the component's life the adhesive strength may be weakened by heating to 100° C., and separating the rigidiser from the flexible substrate, enabling recycling of both parts.

Non-Conductive Adhesive 2 (Hot Water Unzippable)

Cross link thermoset, cyclic amine allows cross link density to be controlled. Polymer unzippable—the polymer network breaks up on heating.

This adhesive has been designed to be screen printed onto rigid and flexible substrates, that can then be bonded by pressing or rolling together. The adhesive strength may be weakened by immersion in hot water, and separating the rigidiser from the flexible substrate, enabling recycling of both parts.

Bond B—Materials Which may be Used in the Flexible Circuit Layer

Ink 1

This insulation ink is a thermoplastic, screen-printing product, developed for use in flexible polymer applications. It may be printed on to flexible polymeric substrates, such as Polyimide and PET substrates, to create an insulation layer over conductive tracks for general circuit applications. It is compatible with the range of silver products described below, in order to construct simple circuits. The ink has under gone testing to show that it is very flexible and provides sufficient electrical insulation.

Ink 2

This product is a thermoplastic, screen-printing silver ink. It may be screen-printed on to flexible polymeric substrates, such as Polyimide, PEN and PET, to create a highly conductive track for general circuitry. The ink has under gone electrical and mechanical testing which has shown that it is very flexible and has good conductivity. The printed silver tracks are soluble in most organic solvents, hence the substrates may be reused at the end of the component's life.

Bond C—Conductive Adhesives Which may be Used to Connect the Electrical Circuit Components to the Rest of the Circuitry Conductive Adhesive 1 (Non-Conductive Adhesive 2 Plus Silver)

This silver ink can be used in a wide range of applications, as a conductive adhesive for component attach, it has excellent chemical resistance with good adhesion. It may be screen-printed on to flexible polymeric substrates, such as Polyimide, PEN and PET. This product is based on a unique curing process that results in a low temperature formation of a thermosetting conductive coating. This silver adhesive may be unzipped by immersion in hot water.

Conductive Adhesive 2

This silver ink can be used in a wide range of applications, as a conductive adhesive for component attach. It has excellent chemical resistance combined with good adhesion. It is designed to be stencil-printed and has a higher viscosity for this reason. This product is based on a unique curing process that results in a low temperature formation of a thermosetting conductive coating that combines excellent chemical, solvent and abrasion resistance. The components may be removed from the substrate by breaking this bond. This is done by immersion in hot water.

The invention claimed is:

1. Electronic circuit assembly comprising a substrate and circuit components attached to the substrate by means of an electrically conductive adhesive, wherein the adhesive is releasable under predetermined release conditions to enable the circuit components to be removed from the substrate for recovery or re-use, wherein the release conditions comprise one or more of: heating to a temperature of between approximately 80° C. and 100° C., exposure to a jet of hot water or steam, or immersion of the assembly in a hot water bath.

2. Electronic circuit assembly as claimed in claim 1, wherein the circuit components are located on a first surface of the substrate, and are attached by means of the adhesive to electrical connections provided on the first surface of the substrate, and wherein the adhesive is arranged on the substrate in a circuit pattern whereby to make electrical connections between the circuit components.

3. Electronic circuit assembly as claimed in claim 1, wherein the substrate comprises one or more layers of conductive tracking provided on its surface, and the circuit components are secured by the adhesive to the conductive tracking to form an electrical circuit.

4. Electronic circuit assembly as claimed in claim 3, wherein the conductive tracking is formed from conductive ink.

5. Electronic circuit assembly as claimed in claim 1, wherein the substrate comprises a flexible substrate formed from, for example, polyimide, PEN or PET, and the flexible substrate comprises integrally formed electrical components, e.g. resistances, switches or connection points.

6. Electronic circuit assembly as claimed in claim 1, wherein the substrate comprises a flexible substrate to which the circuit components are secured by means of the electrically conductive adhesive, wherein the flexible substrate is secured to a rigid substrate formed from, for example, polyester, by means of a further releasable, preferably non-conductive, adhesive whereby to further enable the flexible substrate to be removed from the rigid substrate under predetermined release conditions.

7. Electronic circuit assembly as claimed in claim 6, wherein the release conditions of the conductive adhesive are the same as those of the further adhesive, whereby to enable simultaneous separation of the circuit components and the rigid substrate from the flexible substrate.

8. Electronic circuit assembly as claimed in claim 6, wherein the release conditions of the conductive adhesive are different from those of the further adhesive, whereby to enable separation of the circuit components and the rigid substrate from the flexible substrate to take place separately.

9. Electronic circuit assembly as claimed in claim 1, wherein the adhesive comprises polymer based thermoplastic adhesive and/or cross-link thermosetting cyclic amine adhesive.

10. Electronic circuit assembly comprising an electrical circuit integrally formed on a flexible substrate, the flexible substrate being attached to a rigid substrate by means of an adhesive, wherein the adhesive is releasable under predetermined release conditions to enable the electrical circuit to be removed from the rigid substrate for recovery or re-use, wherein the release conditions comprise one or more of: heating to a temperature of between approximately 80° C. and 100° C., exposure to a jet of hot water or steam, or immersion of the assembly in a hot water bath.

11. Method of manufacturing an electronic circuit assembly, comprising:
    providing a substrate;
    providing an electrically conductive adhesive; and
    attaching circuit components to the substrate with the electrically conductive adhesive, wherein the adhesive is releasable under predetermined release conditions to enable the circuit components to be removed from the substrate for recovery or re-use, wherein the release conditions comprise one or more of: heating to a temperature of between approximately 80° C. and 100° C., exposure to a jet of hot water or steam, or immersion of the assembly in a hot water bath.

12. The method as claimed in claim 11, wherein the circuit components are located on a first surface of the substrate, and are attached by means of the adhesive to electrical connections provided on the first surface of the substrate, and wherein the adhesive is arranged on the substrate in a circuit pattern whereby to make electrical connections between the circuit components.

13. The method as claimed in claim 11, wherein the substrate comprises one or more layers of conductive tracking provided on its surface, and the circuit components are secured by the adhesive to the conductive tracking to form an electrical circuit.

14. The method as claimed in claim 13, wherein the conductive tracking is formed from conductive ink.

15. The method as claimed in claim 11, wherein the substrate comprises a flexible substrate formed from, for example, polyimide, PEN or PET, and the flexible substrate comprises integrally formed electrical components, e.g. resistances, switches or connection points.

16. The method as claimed in claim 11, wherein the substrate comprises a flexible substrate to which the circuit components are secured by means of the electrically conductive adhesive, wherein the flexible substrate is secured to a rigid substrate formed from, for example, polyester, by means of a further releasable, preferably non-conductive, adhesive whereby to further enable the flexible substrate to be removed from the rigid substrate under predetermined release conditions.

17. The method as claimed in claim 11, wherein the adhesive comprises polymer based thermoplastic adhesive and/or cross-link thermosetting cyclic amine adhesive.

18. The method of claim 11, wherein the providing the electrically conductive adhesive comprises applying the electrically conductive adhesive to the substrate by screen printing, stencil printing, bar coating, or a dot dispense technique.

* * * * *